United States Patent [19]

Delker et al.

[11] 4,168,540

[45] Sep. 18, 1979

[54] REGISTER BUILDING BLOCK WITH SERIES CONNECTED CELLS TO SAVE DISSIPATION LOSS

[75] Inventors: Klaus Delker; Wilhelm Wilhelm, both of Munich, Fed. Rep. of Germany

[73] Assignee: Siemens Aktiengesellschaft, Berlin & Munich, Fed. Rep. of Germany

[21] Appl. No.: 937,531

[22] Filed: Aug. 28, 1978

[30] Foreign Application Priority Data

Sep. 7, 1977 [DE] Fed. Rep. of Germany ....... 2740353

[51] Int. Cl.² .................. G11C 11/40; G11C 5/06
[52] U.S. Cl. .................................... 365/227; 365/155
[58] Field of Search ............................... 365/155, 227

[56] References Cited

U.S. PATENT DOCUMENTS 3,609,702 9/1971 Gardner et al. .................... 365/155
3,609,711 9/1971 Gunn ................................. 365/227

FOREIGN PATENT DOCUMENTS 444249 4/1975 U.S.S.R. .................................... 365/155

Primary Examiner—Stuart N. Hecker
Attorney, Agent, or Firm—Hill, Van Santen, Steadman, Chiara & Simpson

[57] ABSTRACT

A register building block is disclosed comprising binary memory cells of cross-coupled double emitter transistors which are fed from a source of constant current and addressed by raising the collector potential. Given a predetermined operating voltage, two memory cells are connected in series to save dissipation loss in each constant current circuit. A switch controlled by one bit of the address is used to select one memory cell from the addressed pair of memory cells. The circuit arrangement disclosed is utilized in highly integrated building blocks.

4 Claims, 3 Drawing Figures

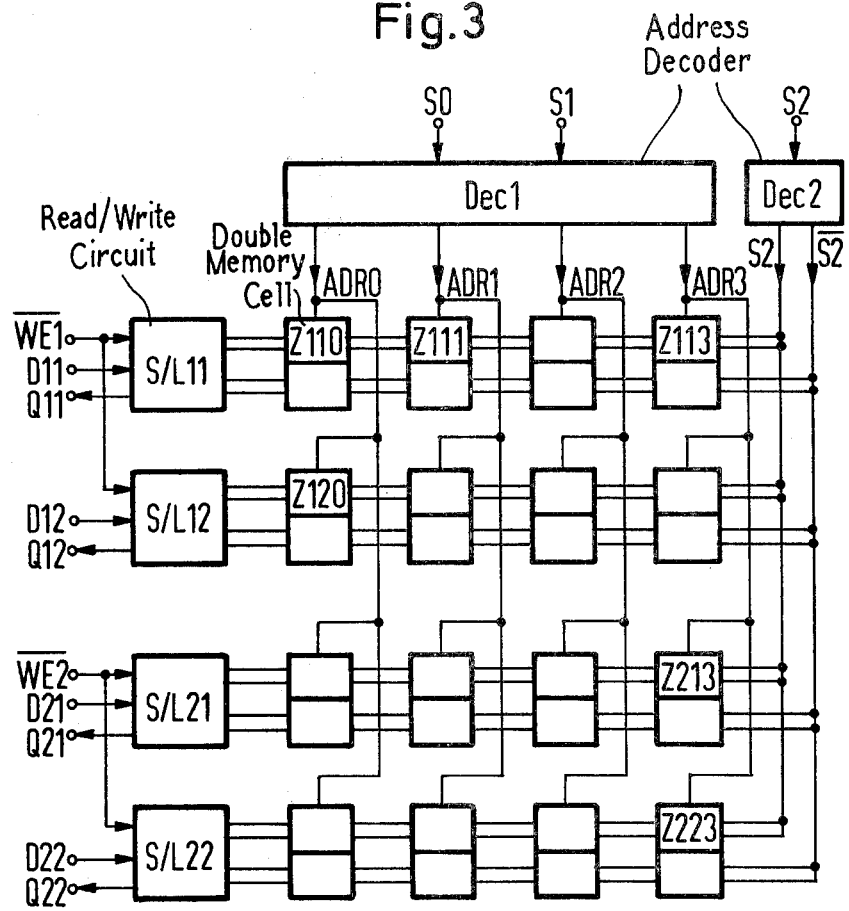

REGISTER BUILDING BLOCK WITH SERIES CONNECTED CELLS TO SAVE DISSIPATION LOSS

BACKGROUND OF THE INVENTION

The invention relates to a register building block with bipolar memory cells wherein each bipolar memory cell has two double emitter transistors connected in cross-coupled fashion.

The product of signal transit time and dissipation loss generally is constant to a large extent with predetermined semiconductor circuit techniques. Within certain limits, a reduction of the signal transit time is possible by increase of the dissipation loss and vice versa. With the integration of circuits having small signal transit times, particularly those of the ECL technique based on the use of differential amplifiers and/or current switches with emitter-coupled transistors, difficulties frequently arise due to inadmissibly high dissipation losses.

In ECL technique it is known, starting from a standardized operating voltage, to use so-called series coupling to save dissipation loss, if the logic design permits this. Therefore, up to three current switches are connected in series to a joint constant current source (see U.S. Pat. No. 3,519,810 incorporated herein by reference). This is accomplished in such a manner that the emitters of the transistors of an "upper" current switch are connected to the collector of a transistor of a "lower" current switch. Then it will depend on the switching position of the "lower" current switch whether the "upper" current switch is fed current at all, that is whether it is effectively controllable.

A memory cells usable in connection with ECL circuits is known from the literature article "IEEE spectrum" May 1971, pages 42–48, particularly FIG. 3 (C), incorporated herein by reference. The memory cell comprises two cross-coupled double emitter transistors with two ohmic load resistances which are connected unilaterally with a word selection line. The emitters of the transistors on each side are connected to a bit line, and the other two emitter are connected jointly to a source of constant current.

By observing in memory circuits the access time in view of the signal transit time, particularly the time required for recording new information, then for the remainder the initially mentioned condition applies whereby the reduction of the access time must be paid by increased dissipation loss. Access times as short as possible are an important goal, particularly in register building blocks.

SUMMARY OF THE INVENTION

According to the invention, memory cells of known construction are used in creating fast register circuits in which a substantial reduction of the dissipation loss is accomplished without loss of speed. Because register circuits are to be compatible with other ECL circuits, it is assumed that a standardized operating voltage is predetermined. According to the invention, a double memory cell is provided having two series-connected bipolar memory cells. Each bipolar memory cell has two double emitter transistors each having an ohmic collector-connected load resistance. Bases and collectors of the transistors are cross-coupled. One emitter of each transistor is commonly connected to a constant current source and a second emitter of each transistor is connected to a bit line. The selection of a double memory cell is accomplished by raising the collector potential of the double memory cells. A switch means is provided for selecting a desired one of the two memory cells within an addressed double memory cell. The switch means is controlled by a bit of the address used to select the double memory cell.

BRIEF DESCRIPTION OF THE DRAWINGS

FIG. 3 shows a diagrammatic representation of an 8×4 bit register.

DESCRIPTION OF THE PREFERRED EMBODIMENTS

Figure 1:
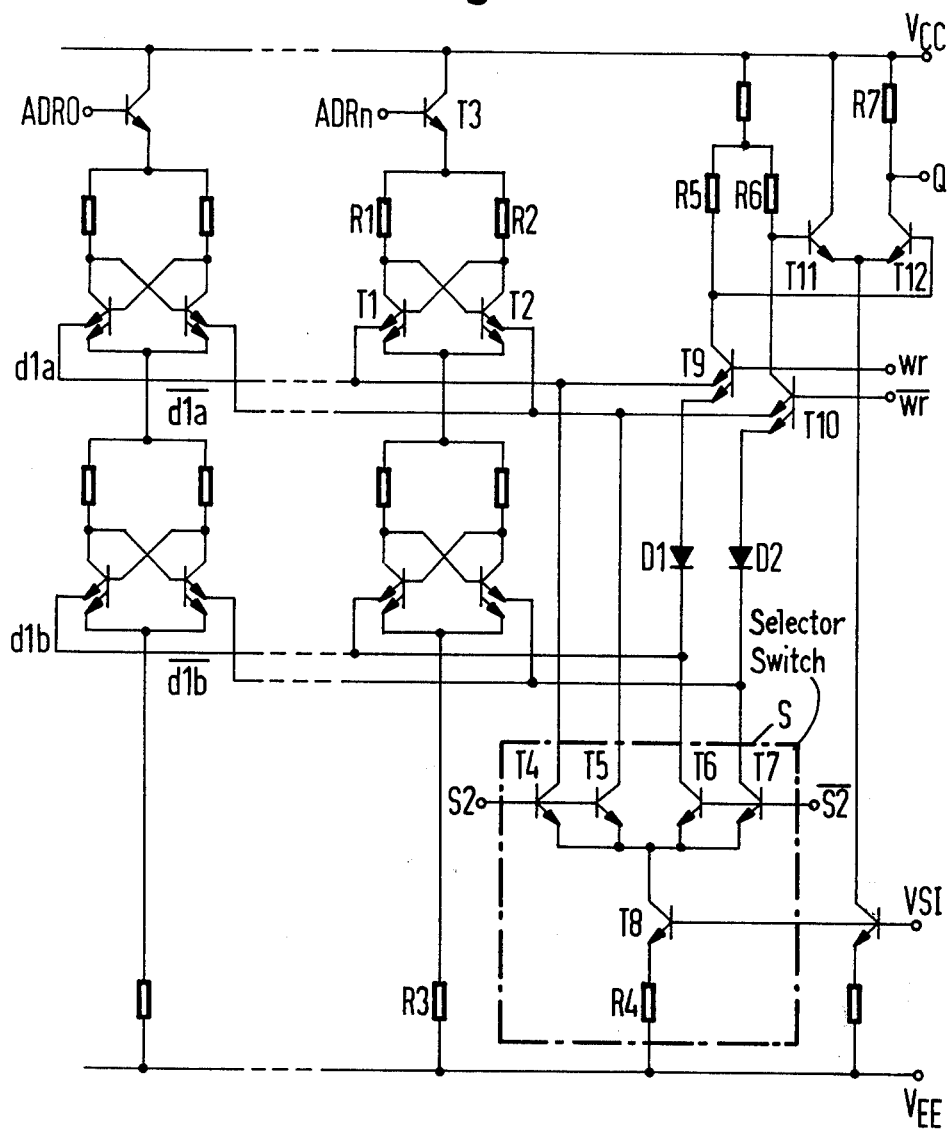
FIG. 1 shows an arrangement according to the invention of memory cells with a selector system and a reading system.

FIG. 1 shows two double memory cells or pairs of memory cells which were created out of the series connection of two known memory cells. The memory cells themselves are identical. Each comprises the double emitter transistors T1 and T2 whereby in each case the base of the one transistor is connected to the collector of the other transistor. The resistances R1 and R2 form the load resistances. The emitters on one side of the two transistors T1 and T2 are consolidated and connected via the second memory of the pair of cells to a constant current source which is approximated here by a relatively high-ohmic resistance R3. The second emitters of the transistors of the memory cells are connected to bit lines, dla and $\overline{dla}$ and/or dlb and $\overline{dlb}$ which always are provided jointly for n memory cells.

The pairs of memory cells are slected via selector lines ADR0 to ADRn which are fed by an address decoder not shown in FIG. 1. To keep the load of the outputs of the address decoder low, a transistor T3 is inserted as emitter follower in each constant current path. Actually, as a rule several memory cell pairs are connected simultaneously within one register, building, in fact, as many pairs as the word stored in the register has bits.

Because the contents of all memory cells are independent of each other and only pairs of memory cells can be selected via the selector lines ADR0 to ADRn, the memory cell still must be determined within each memory cell pair into which a recording shall be fed or from which a reading is to be taken. The current switch S with the transistors T4 to T7 is used for that purpose; it is controlled by one bit of the coded address and by the inverted value of this bit. The current or selector switch S is fed by a constant current generated with the aid of the transistor T8 with a base connected to a stable potential VSI. The emitter of the transistor T8 is connected via a resistance R4 to the emitter side terminal $V_{EE}$ of a voltage supply source. Although the selection of the particular address bit used to control the switch S is not critical, as a matter of principle here the address bit with the highest value, S2 and/or $\overline{S2}$ was used.

To adjust the potential required for readout or recording on the bit lines dla to $\overline{dlb}$, the additional double emitter transistors T9 and T10 are used. A corresponding potential generated in the record-readout phase according to FIG. 2 must be applied to the base electrodes.

The transistors T1 and T9 and/or T2 and T10 form current switches with emitter-coupled transistors whereby the corresponding emitters in each case are interconnected via the bit lines dla and/or $\overline{dla}$. These two current switches, however, are fed only when the transistors T4 and T5 are current-carrying, that is when the upper memory cell of the memory cell pair has been pre-selected. Assuming that the corresponding memory cell pair also is selected via the selector line ADRn whereby the potential of the entire memory cell is elevated and the lower binary control potential is applied at the base of transistor T9 via line wr, collector current of the transistor T4 also flows through the transistor T1 and controls conduction of the latter, unless it already was previously conductive. Because the higher binary control potential simultaneously connects to the base of the transistor T10 via line $\overline{wr}$, the current flowing through the transistor T5 is taken over by the transistor T10. The lines wr and $\overline{wr}$ are connected to identical average control potentials for the readout of the contents of the selected memory cell. If, for exaple, the transistor T1 of the memory cell is conductive, transistor T9 remains blocked. Transistor T10 is controlled conductively. According to the switching conditions of transistors T9 and T10, different potential drops are produced at their collector resistances R5 and R6. Due to the differences in potential occurring at the collectors of these transistors, the differential amplifier is controlled with the transistors T11 and T12 and the operating resistance R7. The output 0 forms the reading output for all pairs of memory cells connected via joint data lines.

Analogous conditions apply for the lower memory cells of a pair of memory cells if in place of the transistors T4 and T5 of the switch S, the transistors T6 and T7 are conductive. Because the potentials of all switch points of this memory cell are lower by the voltage drop at a base-emitter diode than the corresponding switch points of the upper memory cell, the diodes D1 and D2 are inserted for the compensation of this difference in potential into the emitter feed lines of the transistors T9 and T10 leading to the data lines dlb and $\overline{dlb}$ of the lower memory cell.

Figure 2:
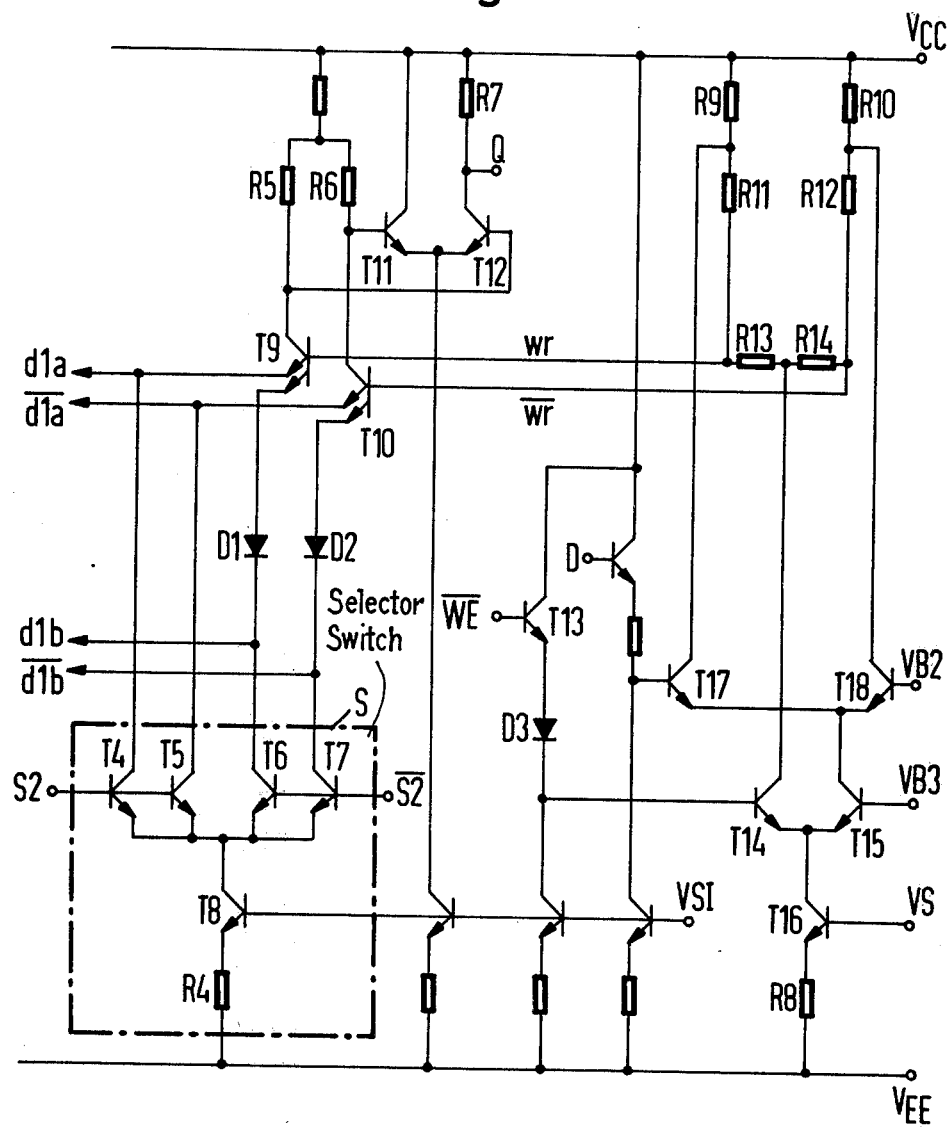
FIG. 2 shows a supplementary circuit arrangement for record-readout control.

FIG. 2 shows the complete circuit arrangement of a write-read phase or step along with the selector switch S. However, since the left portion of the circuit arrangement according to FIG. 2 already was included in FIG. 1 and described in connection therewith and consequently will not be discussed here. The remaining portion of the circuit arrangement is used to prepare the correct control signals for the transistors T9 and T10 according to the function of the input signals at the input $\overline{WE}$ for the write-read control and at the data input D. The logic signal value present at the data input D is then taken over into the addressed memory cell if at the same time at the control input $\overline{WE}$ the lower binary signal value is present. Because of the permissible shift of potential by the transistor T3 and the diode D3, the base potential of the transistor T14 is lower in this case than the reference potential VB3. Therefore, the transistor T3 is blocked and transistor T15 takes over the current maintained constant by the current source circuit with the transistor T16 and the resistance R8. Thus the current switch with the transistors T17 and T18 becomes controllable according to the logic value present at the data input. The lines wr and $\overline{wr}$ connected to the base electrodes of the transistors T9 and T10 thus carry different control potentials.

If on the other hand the higher binary signal value is present at the control input $\overline{WE}$, transistor T14 becomes current-carrying and transistor T15 is blocked. The bridge arrangement consisting of resistances R9 to R14 of identical pairs thus is balanced. No difference in potential then exists between the lines wr and $\overline{wr}$ connected to the terminal points of a diagonal of the bridge and leading to the base electrodes T9 and T10. Thus the necessary condition is provided for reading the addressed memory cell. The readout signal is connected to the read output Q.

FIG. 3 shows in schematic representation a register building block with the double memory cells Z110, Z111, etc. to Z223, with the read-write circuits S/L11 to S/L22, and the address decoders Dec1 and Dec2. A column of double memory cells is selected via the selector lines ADR0 to ADR3 in dependence upon the combination of the low-value address bits S0 and S1 present at the inputs of the address decoder Dec1. The selection of a certain memory cell within the selected double memory cells is accomplished by the output signals of the address decoder Dec2.in dependent upon the address bit S2. Depending on the control signals present at the control inputs $\overline{WE1}$ and $\overline{WE2}$, the data bits at the inputs D11 to D22 are recorded into the register or the contents of the selected memory cells are output via the read outputs Q11 to Q22. According to the illustration in FIG. 3, the control inputs $\overline{WE1}$ and $\overline{WE2}$ are effective in each case for two lines of double memory cells. Analogously, two groups can be fed independently of each other for two bits each. However, the read-write control also can be provided separately or jointly for all four read-write circuits. Moreover, the capacity of the register can be varied so as to width and/or the number of data words to be recorded with respect to the embodiment shown in FIG. 3.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A register building block, comprising:
   (a) a double memory cell member comprising two series-connected bipolar memory cells;
   (b) each bipolar memory cell comprising two double emitter transistors each having an ohmic collector-connected load resistance, bases and collectors of the two transistors being cross-coupled, a first emitter of each transistor being commonly connected to a constant current source and a second emitter of each transistor being connected to a bit line;
   (c) address means connected for elevating a potential of the load resistances of the double memory cell member to address a double memory cell member; and
   (d) switch means controlled by a bit of an address to select one of the bipolar memory cells of a double memory cell member selected by the address.

2. The register building block of claim 1 in which for each one of simultaneously addressed double memory cell members a write-read control circuit is provided.

3. The register building block of claim 1 in which for all simultaneously addressed double memory cell members a common write-read control system is provided.

4. A memory system comprising:
   (a) a plurality of double memory cell members comprising first and second bipolar memory cells;

(b) each memory cell comprising first and second double emitter transistors, a collector of each transistor connecting to an ohmic load, a base of the first transistor connecting to a collector of the second transistor and a collector of the first transistor connecting to a base of the second transistor, first emitters of the first and second transistors of the first memory cell being commonly connected to the ohmic loads of the second memory cell, first emitters of the first and second transistors of the second memory cell being commonly connected to a constant current source, second emitters of the first and second transistors of the first and second memory cells connecting to bit lines, the ohmic loads of the first and second transistors of the first memory cell connecting to selector lines of an address decoder;

(c) switch means connecting to the bit lines for selecting one of the first and second memory cells of an addressed double memory cell member, said switch means being controlled by a bit of an address fed to the address decoder for addressing a double memory cell member; and (d) a write-read circuit means connected to the bit lines for writing and reading data from an address double memory cell member.

* * * * *